(12) United States Patent
Kim et al.

(10) Patent No.: US 7,394,720 B2
(45) Date of Patent: Jul. 1, 2008

(54) CIRCUIT AND METHOD FOR SAMPLING VALID COMMAND USING EXTENDED VALID ADDRESS WINDOW IN DOUBLE PUMPED ADDRESS SCHEME MEMORY DEVICE

(75) Inventors: Hyun-Jin Kim, Gyeonggi-do (KR);
Seong-Jin Jang, Gyeonggi-do (KR);
Jeong-Don Lim, Gyeonggi-do (KR);
Kwang-Il Park, Gyeonggi-do (KR);
Ho-Young Song, Gyeonggi-do (KR);
Woo-Jin Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/560,746

(22) Filed: Nov. 16, 2006

(65) Prior Publication Data

US 2007/0121418 A1 May 31, 2007

(30) Foreign Application Priority Data

Nov. 21, 2005 (KR) .................. 10-2005-0111418

(51) Int. Cl.
*G11C 8/00* (2006.01)
(52) U.S. Cl. .................. 365/230.06; 365/233
(58) Field of Classification Search ............ 365/230.06, 365/230.08, 233
See application file for complete search history.

(56) References Cited

U.S. PATENT DOCUMENTS 6,205,084 B1 3/2001 Akaogi
6,292,430 B1 9/2001 Ohtake et al.
6,751,154 B2 * 6/2004 Kuroda .................. 365/230.06
6,813,396 B1 * 11/2004 Hollstrom et al. ............ 382/305
7,064,997 B2 * 6/2006 Matsuzaki .................. 365/222
2002/0054515 A1 * 5/2002 Kang .................... 365/189.05

FOREIGN PATENT DOCUMENTS

JP     11-073774      3/1999
JP     2000-132966    5/2000
KR     2001-0018223   3/2001

OTHER PUBLICATIONS

English language abstract for Korean Publication No. 2001-0018223, May 3, 2001.
English language abstract for Japanese Publication No. 11-073774, Mar. 16, 1999.
English language abstract for Japanese Publication No. 2000-132966, May 12, 2000.

* cited by examiner

*Primary Examiner*—Huan Hoang
*Assistant Examiner*—Anthan T Tran
(74) *Attorney, Agent, or Firm*—Marger Johnson & McCollom, P.C.

(57) ABSTRACT

Provided are a circuit and method for sampling a valid command using a valid address window extended for a high-speed operation in a double pumped address scheme memory device. A method for extending the valid address window includes: inputting a valid command signal and a first address signal at the first cycle of a clock signal; inputting a second address signal at the second cycle of the clock signal; generating a decoded command signal and extended first and second internal address signals respectively in response to the command signal and the address signals; and latching and decoding the extended first and second internal address signals in response to the decoded command signal.

16 Claims, 9 Drawing Sheets

CIRCUIT AND METHOD FOR SAMPLING VALID COMMAND USING EXTENDED VALID ADDRESS WINDOW IN DOUBLE PUMPED ADDRESS SCHEME MEMORY DEVICE

CROSS-REFERENCE TO RELATED PATENT APPLICATION

This application claims the benefit of Korean Patent Application No. 10-2005-0111418, filed on Nov. 21, 2005, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a circuit and method for sampling a valid command using an extended valid address window in a double pumped address scheme memory device.

2. Description of the Related Art

Figure 1:
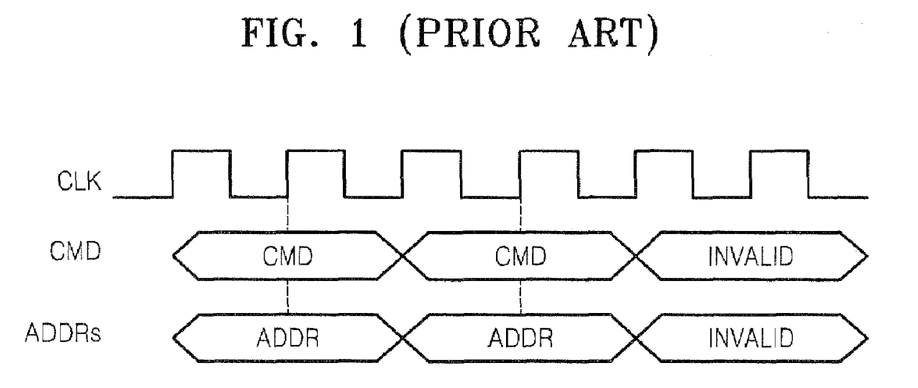
FIG. 1 is a timing diagram of signals of a conventional synchronous memory device.

As the capacity of a memory device increases, the number of address signals for addressing memory cells increases. The address signals are provided to the memory device through address pins. In a synchronous memory device such as SRAM, command signals CMD and address signals ADDRs are input in synchronization with a clock signal CLK to the memory device, as shown in FIG. 1. The command signals CMD include signals /RAS, /CAS, /CS and /WE and the address signals ADDRs are, for example, 12 address signals A0 through A11.

To input the address signals A0 through A11 to the memory device, the 12 address signals are connected to the memory device through routing of a system board. The number of address pins of the memory device can be reduced from 12 (A0 through A11) to 6 (A0 through A5) in a double pumped address scheme. This simplifies system board design. Furthermore, internal power of a chip can be stabilized by using a power pad instead of an address pad removed due to the decrease in the number of address signal lines. Accordingly, the double pumped address scheme was developed.

Figure 2:
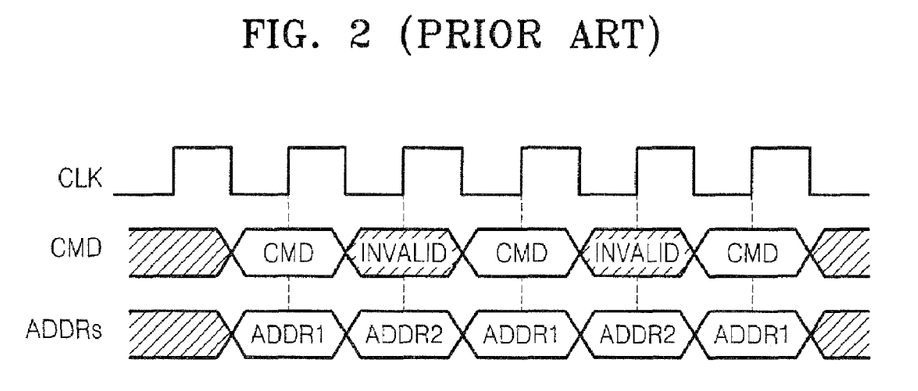
FIG. 2 is a timing diagram of signals of a double pumped address scheme.

In the double pumped address scheme, a valid command CMD and a first address ADDR1 are input at the first rising edge of a clock signal CLK and a second address ADDR2 is input at the second rising edge of the clock signal CLK, as shown in FIG. 2. In addition, a valid command is input at the first rising edge of the clock signal CLK and an invalid command is input at the second rising edge of the clock signal CLK. The 12 address signals A0 through A11 are divided into two groups and respectively set to the first address ADDR1 and the second address ADDR2. For example, the 6 address signals A0 through A5 are set to the first address ADDR1 and the 6 address signals A6 through A11 are set to the second address ADDR2.

Figure 3:
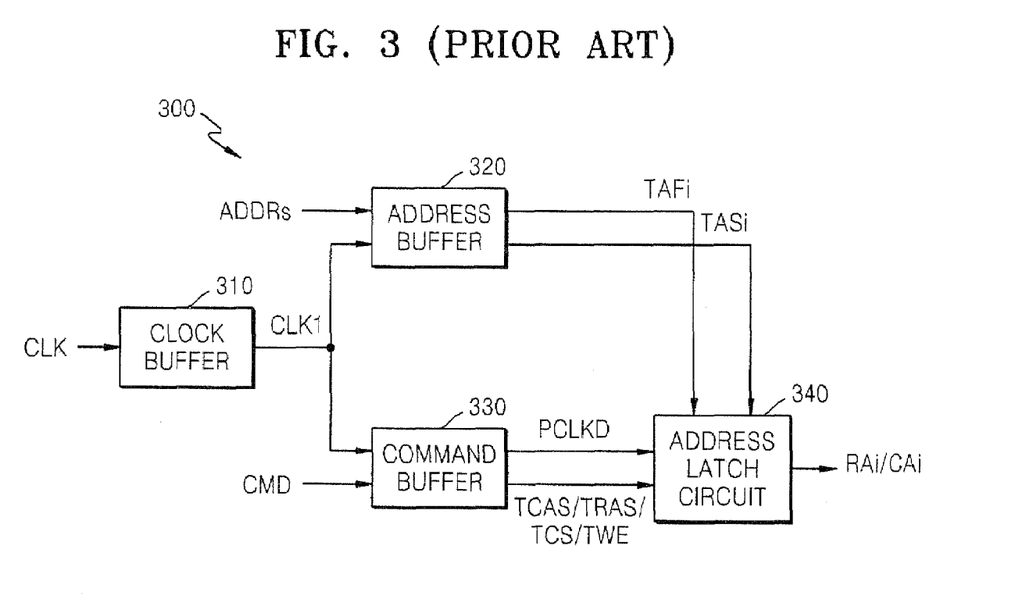
FIG. 3 is a block diagram of a conventional memory device for realizing the double pumped address scheme.

FIG. 3 is a block diagram of a conventional double pumped address scheme memory device 300. Referring to FIG. 3, the memory device 300 includes a clock buffer 310, an address buffer 320, a command buffer 330, and an address latch circuit 340.

The clock buffer 310 receives an external clock signal CLK and generates a first internal clock signal CLK1. The address buffer 320 receives address signals ADDRs in response to the first internal clock signal CLK1 and outputs first and second internal address signals TAFi and TASi. The command buffer 330 receives command signals CMD in response to the internal clock signal CLK1 and generates a second internal clock signal PCLKD and internal command signals TCAS/TRAS/TCS/TWE. The address latch circuit 340 receives the internal command signals TCAS/TRAS/TCS/TWE and the first and second internal address signals TAFi and TASi in response to the second internal clock signal PCLKD and generates a row address RAi and a column address CAi.

Figure 4:
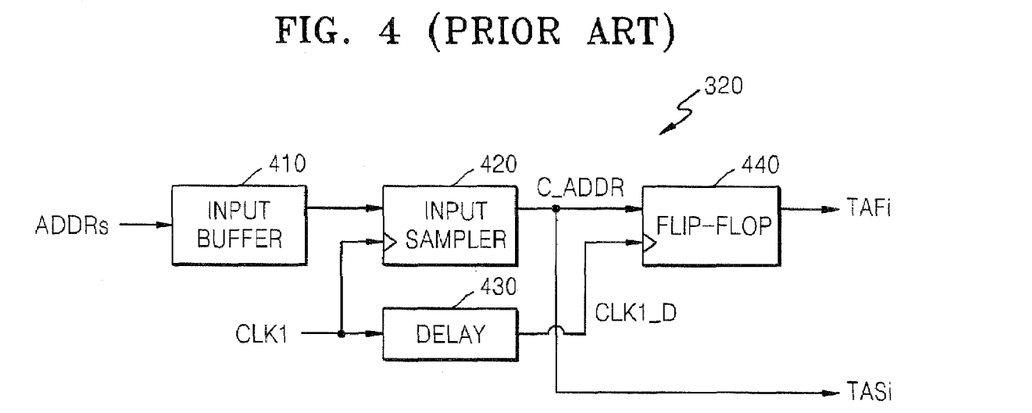
FIG. 4 is a block diagram of an address buffer of the memory device of FIG. 3.

FIG. 4 is a block diagram of the address buffer 320. Referring to FIG. 4, the address buffer 320 includes an input buffer 410 receiving the address signals ADDRs, an input sampler 420 sampling the output signal of the input buffer 410 in response to the first internal clock signal CLK1 and generating a clocked address signal C_ADDR, a delay 430 delaying the first internal clock signal CLK1, and a flip-flop 440 receiving the clocked address signal C_ADDR in response to the delayed first internal clock signal CLK1_D. The output signal of the input sampler 420 corresponds to the second internal address signal TAFi and the output signal of the flip-flop 440 corresponds to the first internal address signal TAFi.

Figure 5:
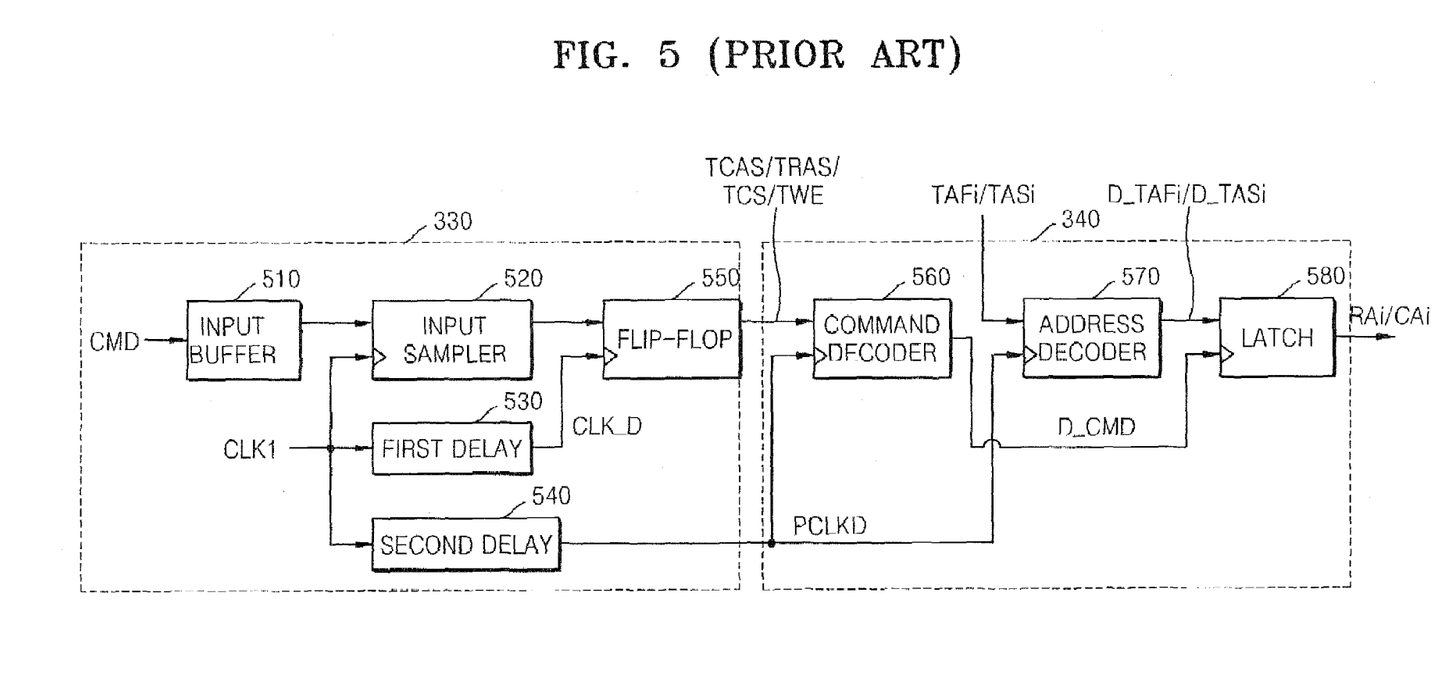
FIG. 5 is a block diagram of a command buffer and an address latch circuit of the memory device of FIG. 3.

FIG. 5 is a block diagram of the command buffer 330 and the address latch circuit 340. Referring to FIG. 5, the command buffer 330 includes an input buffer 510 receiving the command signal CMD, an input sampler 520 sampling the output signal of the input buffer 510 in response to the first internal clock signal CLK1, a first delay 530 delaying the first internal clock signal CLK1, a second delay delaying the first internal clock signal CLK1 to generate the second internal clock signal PCLKD, and a flip-flop 550 receiving the output signal of the input sampler 520 in response to the delayed first internal clock signal CLK1_D and generating the internal command signals TCAS/TRAS/TCS/TWE.

The address latch circuit 340 includes a command decoder 560 decoding the internal command signals TCAS/TRAS/TCS/TWE in response to the second internal clock signal CLK2 and generating a decoded command signal D_CMD, an address decoder 570 receiving the first and second internal address signals TAFi and TASi and generating decoded first and second internal address signals D_TAFi and D_TASi in response to the second internal clock signal PCLKD, and a latch 580 receiving the decoded first and second internal address signals D_TAFi and D_TASi and generating the row address RAi and column address CAi in response to the decoded command signal D_CMD.

Figure 6:
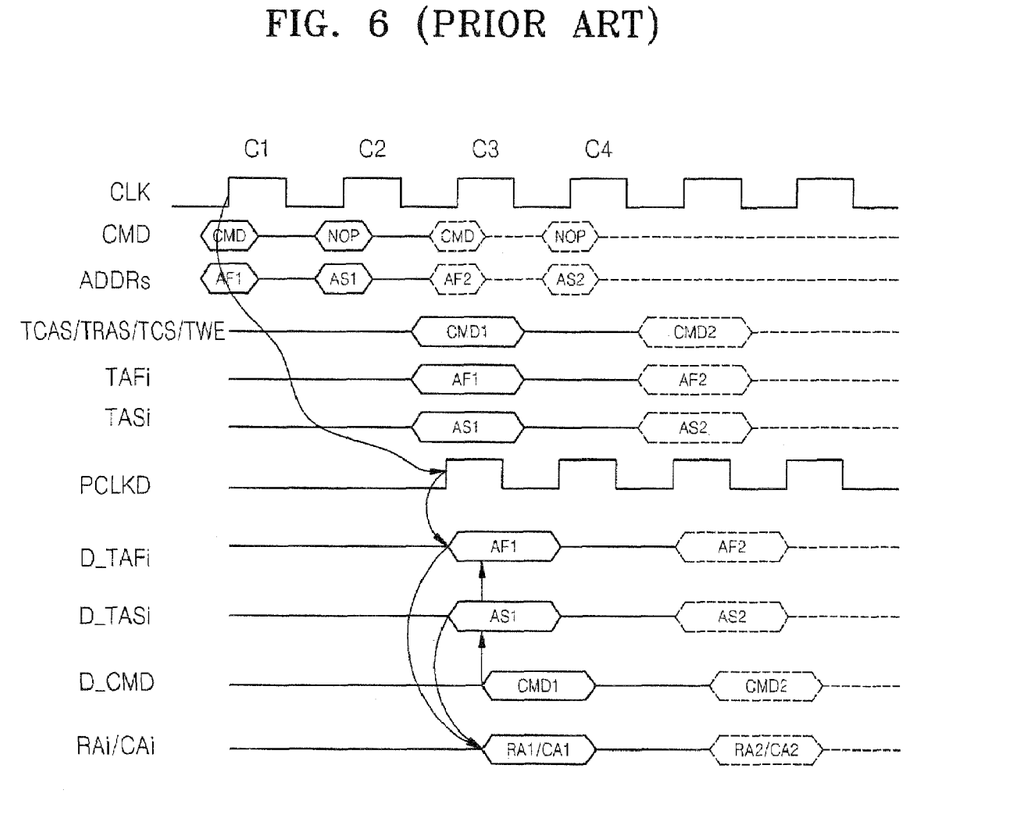
FIG. 6 is a timing diagram for explaining the operation of the memory device of FIG. 3.

FIG. 6 is a timing diagram for explaining the operation of the memory device 300 of FIG. 3. Referring to FIG. 3, the command signal CMD and a first address signal AF1 are input at the first rising edge C1 of the external clock signal CLK and a second address signal AS1 is input at the second rising edge C2. The internal command signal and the first and second internal address signals TAFi and TASi are generated at the third rising edge C3 of the external clock signal CLK. The second internal clock signal PCLKD is generated being delayed from the external clock signal CLK by a predetermined time. The decoded first and second internal address signals D_TAFi and D_TASi are generated in response to the internal clock signal PCLKD, and the decoded command signal D_CMD is generated. The decoded first and second internal address signals D_TAFi and D_TASi are latched in response to the decoded command signal D_CMD and the row address RAi and the column address CAi are generated.

The row address RAi and the column address CAi can be stably generated only when the decoded command signal D_CMD is generated within the window of the decoded first and second internal address signals D_TAFi and D_TASi. As shown in FIG. 6, the valid address window of the decoded first and second internal address signals D_TAFi and D_TASi corresponds to one clock cycle of the external clock signal CLK.

However, the first and second internal address signals TAFi and TASi input to the address decoder 570 have a skew between them in order to generate the decoded first and second internal address signals D_TAFi and D_TASi. Furthermore, the valid address window of the decoded first and second internal address signals D_TAFi and D_TASi becomes narrower as the operating frequency of the memory device 300 increases. Accordingly, a margin between the first and second internal address signals D_TAFi and D_TASi and the decoded command signal D_CMD is insufficient.

SUMMARY OF THE INVENTION

The present invention provides a double pumped address scheme for generating the first and second internal address signals D_TAFi and D_TASi having a valid window greater than two clock cycles of the external clock signal CLK.

The present invention also provides a method for extending a valid address window in the double pumped address scheme.

According to an aspect of the present invention, there is provided a memory device comprising: a valid command signal generator receiving command signals in response to a clock signal and generating a valid command signal; an address buffer receiving first and second address signals in response to the clock signal, generating first and second internal address signals from the first and second address signals, and generating extended first and second internal address signals in response to the valid command signal; a command buffer generating internal command signals from the command signals in response to the clock signal and delaying the clock signal to generate an internal clock signal; and an address latch circuit decoding the internal command signals in response to the internal clock signal to generate a decoded internal command signal, and latching and decoding the extended first and second internal address signals in response to the decoded internal command signal.

The valid command signal generator may include a first input sampler sampling a RAS signal in response to the clock signal, a second input sampler sampling a CAS signal in response to the clock signal, a third input sampler sampling a chip select signal in response to the clock signal, a delay delaying the clock signal; a valid command decoder receiving the output signals of the first, second and third input samplers and judging whether the RAS, CAS and chip select signals are valid, and a flip-flop receiving the output signal of the valid command decoder in response to the output signal of the delay and generating the valid command signal.

The address buffer may include an input buffer receiving the first and second address signals, an input sampler sampling the output signal of the input buffer in response to the clock signal and generating the second internal address signal, a delay delaying the clock signal, a flip-flop receiving the output signal of the input sampler in response to the output signal of the delay and generating the first internal address signal from the received signal, a first latch latching the first internal address signal in response to the valid command signal and outputting the extended first internal address signal, and a second latch latching the second internal address signal in response to the valid command signal and generating the extended second internal address signal.

The command buffer may include an input buffer receiving the command signals, an input sampler sampling the output signal of the input buffer in response to the clock signal and generating the internal command signal, and a delay delaying the clock signal to generate the internal clock signals.

The address latch circuit may include a command decoder decoding the internal command signals in response to the internal clock signal to generate the decoded internal command signal, and an address decoder latching and decoding the extended first and second internal address signals in response to the decoded internal command signal.

The address latch circuit may further include a delay delaying the decoded internal command signal, and the address decoder may latch and decode the extended first and second internal address signals in response to the delayed decoded internal command signal.

The memory device can be a double pumped address scheme memory device. According to another aspect of the present invention, there is provided method for extending a valid address window comprising: inputting a valid command signal and a first address signal at the first cycle of a clock signal; inputting a second address signal at the second cycle of the clock signal; generating a decoded command signal and extended first and second internal address signals respectively in response to the command signal and the address signals; and latching and decoding the extended first and second internal address signals in response to the decoded command signal.

The valid window of the decoded command signal may correspond to at least one clock cycle of the clock signal, and the valid window of the extended first and second internal address signals may correspond to at least two clock cycles of the clock signal.

The valid address window extending method may be applied to a double pumped address scheme memory device.

According to another aspect of the present invention, there is provided a method for extending a valid address window of a double pumped address scheme comprising: receiving a clock signal and generating a first internal clock signal; receiving command signals in response to the first internal clock signal, judging whether the command signals are valid and generating a valid command signal; receiving first and second address signals in response to the first internal clock signal and generating first and second internal address signals; latching the first and second internal address signals in response to the valid command signal to generate extended first and second internal address signals; generating internal command signals from the command signals in response to the first internal clock signal; delaying the first internal clock signal to generate a second internal clock signal; decoding the internal command signals in response to the second internal clock signal to generate a decoded internal command signal; and decoding the extended first and second internal address signals in response to the decoded internal command signal.

According to the double pumped address scheme memory device according to the present invention, the valid window of the extended first and second internal address signals E_TAFi and E_TASi corresponds to at least two clock cycles of the clock signal CLK and thus a margin between the decoded internal command signal D_CMD and the extended first and second internal address signals E_TAFi and E_TASi for latching the extended first and second internal address signals E_TAFi and E_TASi can be easily secured.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

Figure 7:
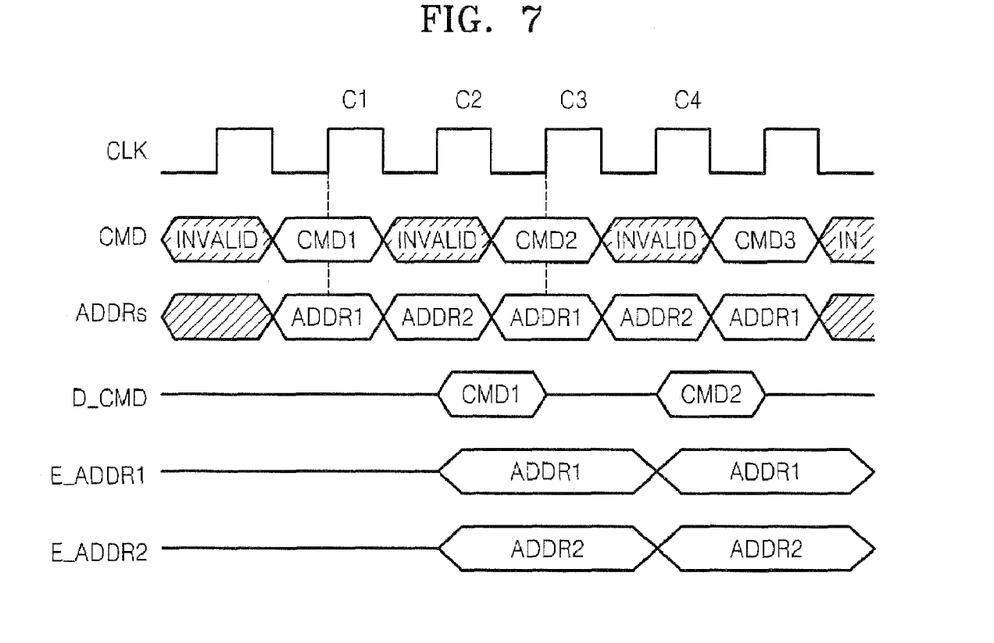
FIG. 7 is a timing diagram of signals of a double pumped address scheme having an extended valid address window according to the present invention.

FIG. 7 is a timing diagram of signals of a double pumped address scheme having an extended valid address window according to the present invention. Referring to FIG. 7, similarly to the conventional double pumped address scheme shown in FIG. 2, a valid command signal CMD1 and a first address signal ADDR1 are input at the first rising edge C1 of an external clock signal CLK and a second address signal ADDR2 is input at the second rising edge C2 of the external clock signal CLK.

A decoded command signal D_CMD and extended first and second internal address signals E_ADDR1 and E_ADDR2 are generated respectively in response to the command signal CMD1 and the address signals ADDRs. The valid window of the decoded command signal D_CMD corresponds to one clock cycle of the external clock signal CLK and the valid window of the extended first and second internal address signals E_ADDR1 and E_ADDR2 corresponds to at least two clock cycles of the external clock signal CLK. Accordingly, a margin capable of latching the extended first and second internal address signals E_ADDR1 and E_ADDR2 in response to the decoded command signal D_CMD is increased.

Figure 8:
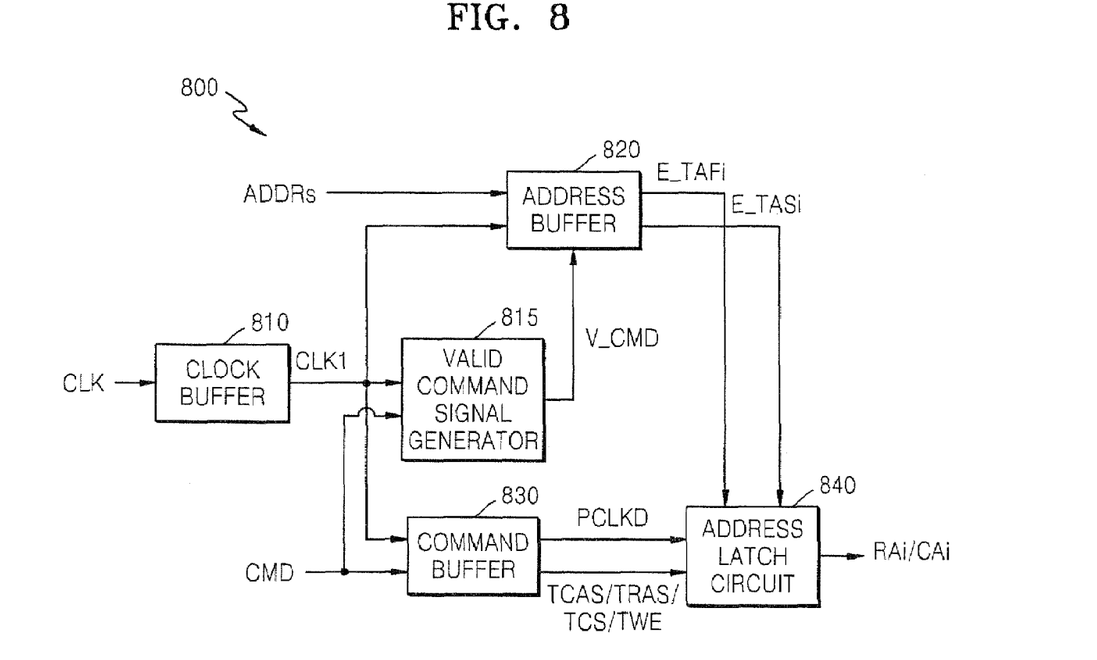
FIG. 8 is a block diagram of a memory device for realizing the double pumped address scheme having an extended valid address window of FIG. 7 according to an embodiment of the present invention.

FIG. 8 is a block diagram of a double pumped address scheme memory device 800 having the extended valid address window shown in FIG. 7 according to an embodiment of the present invention. Referring to FIG. 8, the memory device 800 includes a clock buffer 810, a valid command signal generator 815, an address buffer 820, a command buffer 830, and an address latch circuit 840.

The clock buffer 810 generates a first internal clock signal in response to the external clock signal CLK. The valid command signal generator 815 receives a command signal CMD in response to the first internal clock signal CLK1 and generates a valid command signal V_CMD. The address buffer 820 receives the first internal clock signal CLK1 and the valid command signal V_CMD in response to the first internal clock signal CLK1 and generates the first and second internal address signals TAFi and TASi.

The command buffer 830 receives the command signal CMD in response to the first internal clock signal CLK1 and generates a second internal clock signal PCLKD and internal command signals TCAS/TRAS/TCS/TWE. The address latch circuit 840 receives the first and second address signals TAFi and TASi in response to the second internal clock signal PCLKD and the internal command signals TCAS/TRAS/TCS/TWE and generates a row address RAi and a column address CAi.

Figure 9:
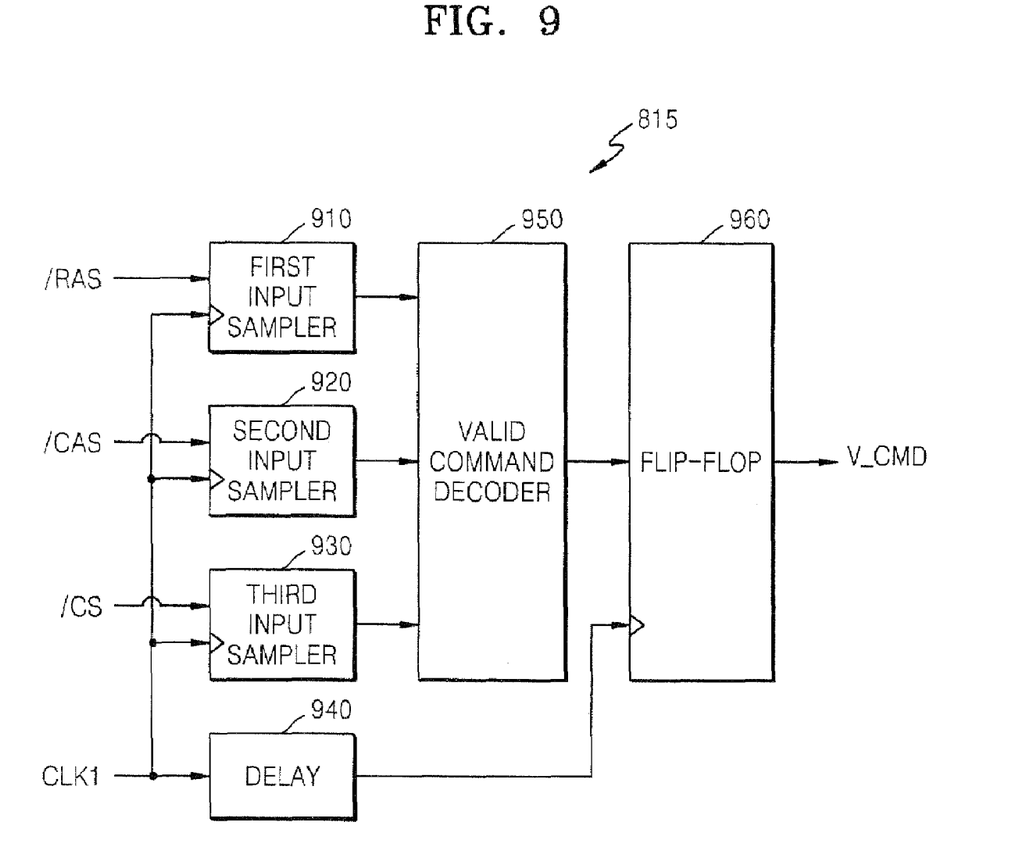
FIG. 9 is a block diagram of a valid command signal generator of FIG. 8.

FIG. 9 is a block diagram of the valid command signal generator 815. Referring to FIG. 9, the valid command signal generator 815 includes first, second and third input samplers 910, 920 and 930, a delay 940, a valid command decoder 950 and a flip-flop 960.

The first input sampler 910 samples a row address select (RAS) signal /RAS in response to the first internal clock signal CLK1, the second input sampler 920 samples a column address select (CAS) signal /CAS in response to the first internal clock signal CLK1, and the third input sampler 930 samples a chip select signal /CS in response to the first internal clock signal CLK1. The output signals of the first, second and third input samplers 910, 920 and 930 are provided to the valid command decoder 950 which judges whether the signals /RAS, /CAS and /CS are valid. The delay 940 delays the first internal clock signal CLK1. The flip-flop 940 receives the output signal of the valid command decoder 950 in response to the output signal of the delay 940 and generates the valid command signal V_CMD. The valid command signal V_CMD represents that all the command signals /RAS, /CAS and /CS input to the memory device 800 are valid.

Figure 10:
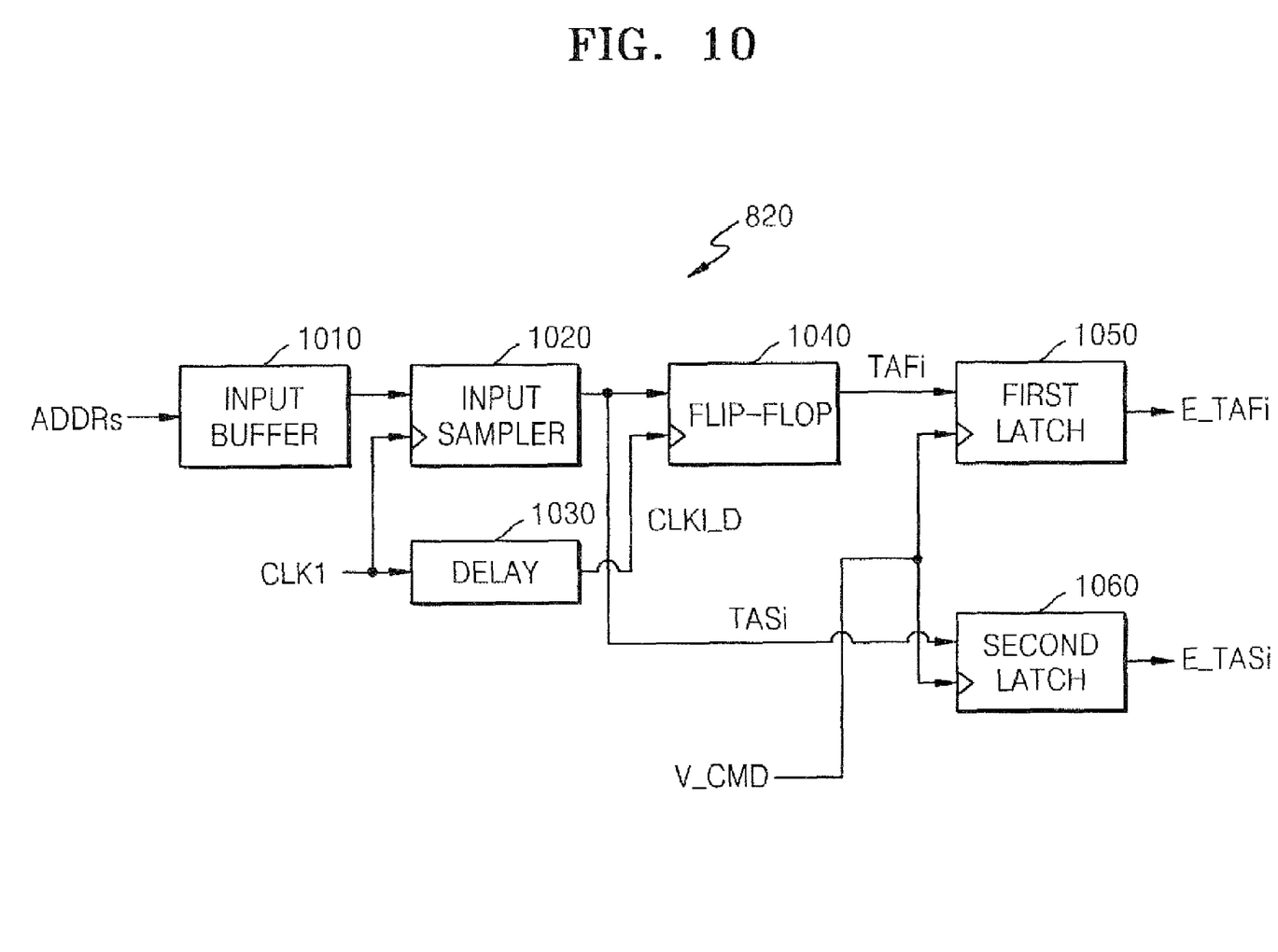
FIG. 10 is a block diagram of an address buffer of FIG. 8.

FIG. 10 is a block diagram of the address buffer 820 of FIG. 8. Referring to FIG. 10, the address buffer 820 includes an input buffer 1010 receiving the address signals ADDRs, an input sampler 1020 receiving the output signal of the input buffer 1010 in response to the first internal clock signal CLK1 and generating the first internal address signal TAFi, a delay 1030 delaying the first internal clock signal CLK1, and a flip-flop 1040 receiving the output signal of the input sampler 1020 in response to the output signal of the delay 1030 and generating the second internal address signal TASi. The address buffer 820 further includes a first latch 1050 latching the output signal of the flip-flop 1040 in response to the valid command signal V_CMD and generating the extended first internal address signal E_TAFi, and a second latch 1060 latching the output signal of the input sampler 1020 in response to the valid command signal V_CMD and generating the extended second internal address signal E_TASi.

The address buffer 820 generates the first and second internal address signals TAFi and TAS1 from the received address signals ADDRS in response to the first internal clock signal CLK1 and generates the extended first and second internal address signals E_TAFi and E_TASi from the first and second internal address signals TAFi and TASi in response to the valid command signal V_CMD.

Figure 11:
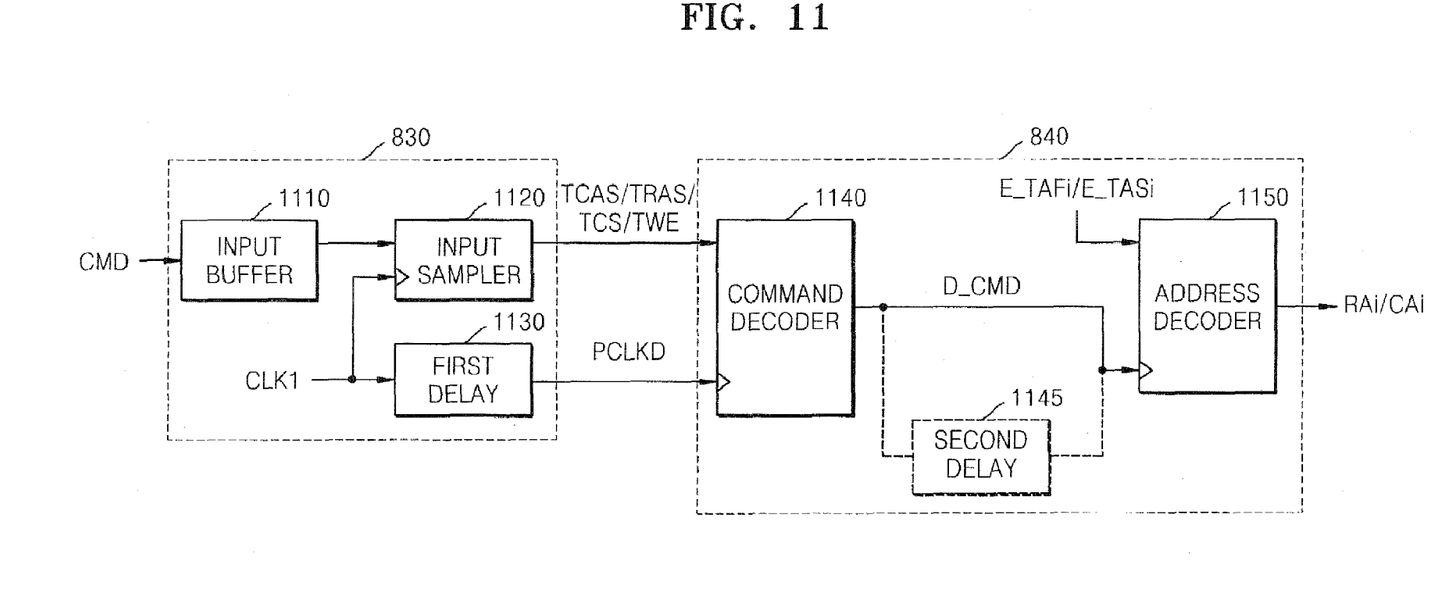
FIG. 11 is a block diagram of a command buffer and an address latch circuit of FIG. 8.

FIG. 11 is a block diagram of the command buffer 830 and the address latch circuit 840 of FIG. 8. Referring to FIG. 11, the command buffer 830 includes an input buffer 1110 receiving the command signal CMD, an input sampler 1120 sampling the output signal of the input buffer 1010 in response to the first internal clock signal CLK1 and generating the internal command signals TCAS/TRAS/TCS/TWE, and a first delay 1130 delaying the first internal clock signal CLK1 to generate a second internal clock signal PCLKD.

The address latch circuit 840 includes a command decoder 1140 decoding the internal command signals TCAS/TRAS/TCS/TWE in response to the second internal clock signal PCLKD to generate the decoded command signal D_CMD, and an address decoder 1150 decoding the extended first and second internal address signals E_TAFi and E_TASi in response to the decoded command signal D_CMD and generating the row address RAi and the column address CAi.

The decoded command signal D_CMD can be an active signal ACT, a precharge signal PRE, a refresh signal REF and a mode register signal MRS, which designate the internal operation of the memory device 800.

The address latch circuit 840 can further include a second delay 1145 for delaying the decoded command signal D_CMD. The output signal of the second delay 1145 can be provided to the address decoder 1150. The reason why the decoded command signal D_CMD is delayed will be explained with reference to FIG. 12.

Figure 12:
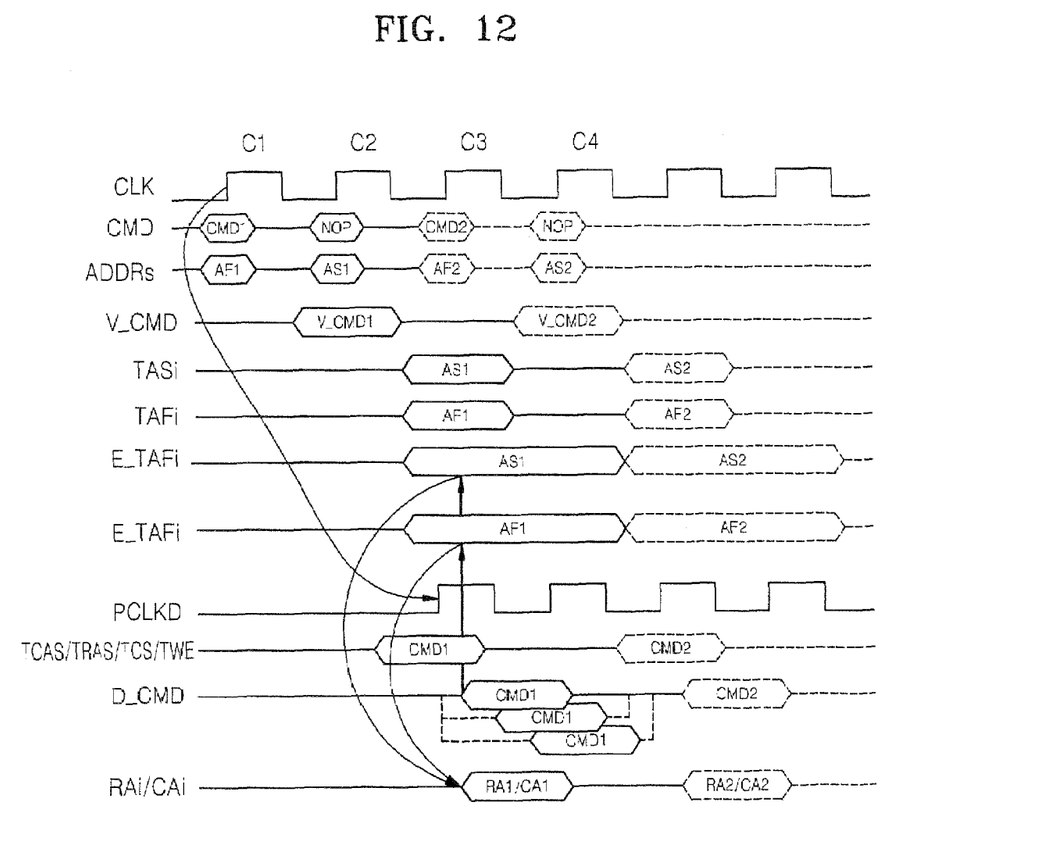
FIG. 12 is a timing diagram for explaining the operation of the memory device of FIG. 8.

FIG. 12 is a timing diagram for explaining the operation of the memory device of FIG. 8. Referring to FIG. 12, the command signal CMD1 and the first address signal AF1 are input at the first rising edge C1 of the external clock signal CLK and the second address signal AS1 is input at the second rising edge C2 of the external clock signal CLK.

The valid command signal V_CMD is generated from the input command signal CMD1 in response to the first internal clock signal (not shown in FIG. 12) similar to the external clock signal CLK, and the first and second internal address signals TAFi and TASi are generated from the input address signals AF1 and AS1. The extended first and second internal address signals E_TAFi and E_TASi are generated from the first and second internal address signals TAFi and TASi in response to the valid command signal V_CMD. The valid window of the extended first and second internal address signals E_TAFi and E_TASi corresponds to at least two clock cycles of the external clock signal.

The internal command signals TCAS/TRAS/TCS/TWE are generated from the command signal CMD1 in response to the first internal clock signal (not shown). The decoded internal command signal D_CMD is generated from the internal command signals TCAS/TRAS/TCS/TWE in response to the second internal clock signal PCLKD. The first and second internal address signals TAFi and TASi are latched in response to the decoded internal command signal D_CMD. The decoded internal command signal D_CMD is within the valid window of the extended first and second internal address signals E_TAFi and E_TASi.

The decoded internal command signal D_CMD can be delayed by a predetermined time by the second delay 1145 shown in FIG. 11. The decoded internal command signal D_CMD is generated in response to the second internal clock signal PCLKD generated at the first rising edge C1 of the external clock signal CLK. The instant of time when the decoded internal command signal D_CMD is generated can precede the instant of time when the extended first and second internal address signals E_TAFi and E_TAS1 are generated because the signals input at the first rising edge C1 of the external clock signal CLK are directly generated as the internal command signals TCAS/TRAS/TCS/TWE in response to the first internal clock signal and then the decoded internal command signal D_CMD is generated in response to the second internal clock signal PCLKD corresponding to the first rising edge C1 of the external clock signal CLK.

That is, the decoded internal command signal D_CMD is delayed by a predetermined time using the second delay 1145 of FIG. 11 such that the instant of time when the decoded internal command signal D_CMD is generated falls in the valid window of the extended first and second internal address signals E_TAFi and E_TASi. Then, the extended first and second internal address signals E_TAFi and E_TASi are latched in response to the decoded command signal D_CMD and the row address RAi and the column address CAi are generated.

According to the double pumped address scheme memory device according to the present invention, the valid window of the extended first and second internal address signals E_TAFi and E_TASi corresponds to at least two clock cycles of the clock signal CLK and thus a margin between the decoded internal command signal D_CMD and the extended first and second internal address signals E_TAFi and E_TASi can be easily secured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory device comprising:
    a valid command signal generator receiving command signals in response to a clock signal and generating a valid command signal;
    an address buffer receiving first and second address signals in response to the clock signal, generating first and second internal address signals from the first and second address signals, and generating extended first and second internal address signals in response to the valid command signal;
    a command buffer generating internal command signals from the command signals in response to the clock signal and delaying the clock signal to generate an internal clock signal; and
    an address latch circuit decoding the internal command signals in response to the internal clock signal to generate a decoded internal command signal, and latching and decoding the extended first and second internal address signals in response to the decoded internal command signal.

2. The memory device of claim 1, wherein the valid command signal generator comprises:
    a first input sampler sampling a RAS signal in response to the clock signal;
    a second input sampler sampling a CAS signal in response to the clock signal;
    a third input sampler sampling a chip select signal in response to the clock signal;
    a delay delaying the clock signal;
    a valid command decoder receiving the output signals of the first, second and third input samplers and judging whether the RAS, CAS and chip select signals are valid; and
    a flip-flop receiving the output signal of the valid command decoder in response to the output signal of the delay and generating the valid command signal.

3. The memory device of claim 1, wherein the address buffer comprises:
    an input buffer receiving the first and second address signals;

an input sampler sampling the output signal of the input buffer in response to the clock signal and generating the second internal address signal;
a delay delaying the clock signal;
a flip-flop receiving the output signal of the input sampler in response to the output signal of the delay and generating the first internal address signal from the received signal;
a first latch latching the first internal address signal in response to the valid command signal and outputting the extended first internal address signal; and
a second latch latching the second internal address signal in response to the valid command signal and generating the extended second internal address signal.

4. The memory device of claim 1, wherein the command buffer comprises:
an input buffer receiving the command signals;
an input sampler sampling the output signal of the input buffer in response to the clock signal and generating the internal command signal; and
a delay delaying the clock signal to generate the internal clock signals.

5. The memory device of claim 1, wherein the address latch circuit comprises:
a command decoder decoding the internal command signals in response to the internal clock signal to generate the decoded internal command signal; and
an address decoder latching and decoding the extended first and second internal address signals in response to the decoded internal command signal.

6. The memory device of claim 5, wherein the address latch circuit further comprises a delay delaying the decoded internal command signal, and the address decoder latching and decoding the extended first and second internal address signals in response to the delayed decoded internal command signal.

7. The memory device of claim 1, wherein the memory device is a double pumped address scheme memory device.

8. A memory device comprising:
a clock buffer receiving a clock signal and generating a first internal clock signal;
a valid command signal generator receiving command signals in response to the first internal clock signal and generating a valid command signal;
an address buffer receiving first and second address signals in response to the first internal clock signal, generating first and second internal address signals from the first and second address signals, and generating extended first and second internal address signals in response to the valid command signal;
a command buffer generating internal command signals from the command signals in response to the first internal clock signal and delaying the first internal clock signal to generate a second internal clock signal; and
an address latch circuit decoding the internal command signals in response to the second internal clock signal to generate a decoded internal command signal, and latching and decoding the extended first and second internal address signals in response to the decoded internal command signal.

9. The memory device of claim 8, wherein the valid command signal generator comprises:
a first input sampler sampling a RAS signal in response to the first internal clock signal;
a second input sampler sampling a CAS signal in response to the first internal clock signal;
a third input sampler sampling a chip select signal in response to the first internal clock signal;
a delay delaying the first internal clock signal;
a valid command decoder receiving the output signals of the first, second and third input samplers and judging whether the RAS, CAS and chip select signals are valid; and
a flip-flop receiving the output signal of the valid command decoder in response to the output signal of the delay and generating the valid command signal.

10. The memory device of claim 8, wherein the address buffer comprises:
an input buffer receiving the first and second address signals;
an input sampler sampling the output signal of the input buffer in response to the first internal clock signal and generating the second internal address signal;
a delay delaying the first internal clock signal;
a flip-flop receiving the output signal of the input sampler in response to the output signal of the delay and generating the first internal address signal from the received signal;
a first latch latching the first internal address signal in response to the valid command signal and outputting the extended first internal address signal; and
a second latch latching the second internal address signal in response to the valid command signal and generating the extended second internal address signal.

11. The memory device of claim 8, wherein the command buffer comprises:
an input buffer receiving the command signals;
an input sampler sampling the output signal of the input buffer in response to the first internal clock signal and generating the internal command signal; and
a delay delaying the first internal clock signal to generate the internal clock signals.

12. The memory device of claim 8, wherein the address latch circuit comprises:
a command decoder decoding the internal command signals in response to the second internal clock signal to generate the decoded internal command signal; and
an address decoder latching and decoding the extended first and second internal address signals in response to the decoded internal command signal.

13. The memory device of claim 12, wherein the address latch circuit further comprises a delay delaying the decoded internal command signal, and the address decoder latching and decoding the extended first and second internal address signals in response to the delayed decoded internal command signal.

14. The memory device of claim 8, wherein the memory device is a double pumped address scheme memory device.

15. A method for extending a valid address window of a double pumped address scheme comprising:
receiving a clock signal and generating a first internal clock signal;
receiving command signals in response to the first internal clock signal, judging whether the command signals are valid and generating a valid command signal;
receiving first and second address signals in response to the first internal clock signal and generating first and second internal address signals;
latching the first and second internal address signals in response to the valid command signal to generate extended first and second internal address signals;
generating internal command signals from the command signals in response to the first internal clock signal;

delaying the first internal clock signal to generate a second internal clock signal;
    decoding the internal command signals in response to the second internal clock signal to generate a decoded internal command signal; and decoding the extended first and second internal address signals in response to the decoded internal command signal.

16. The method of claim 15, wherein the receiving command signals in response to the first internal clock signal, judging whether the command signals are valid and generating a valid command signal comprises:

sampling a RAS signal, a CAS signal and a chip select signal in response to the first internal clock signal;

delaying the first internal clock signal;

judging whether the RAS signal, CAS signal and chip select signal are valid; and generating the valid command signal from the signal obtained in the judgement result in response to the first internal clock signal.

\* \* \* \* \*